(12) United States Patent
Janesch et al.

(10) Patent No.: US 6,650,721 B1
(45) Date of Patent: Nov. 18, 2003

(54) PHASE LOCKED LOOP WITH NUMERICALLY CONTROLLED OSCILLATOR DIVIDER IN FEEDBACK LOOP

(75) Inventors: Stephen T. Janesch, Coopersburg, PA (US); Carl R. Stevenson, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/368,583

(22) Filed: Aug. 5, 1999

(51) Int. Cl.[7] .................................................. H03D 3/24
(52) U.S. Cl. ........................ 375/376; 375/375; 327/156
(58) Field of Search ................................ 375/376, 327, 375/375, 374, 373; 327/147, 150, 156, 159; 331/1 R, 25, 34, 1 A; 329/307–309, 325, 326, 360; 332/127, 128

(56) References Cited

U.S. PATENT DOCUMENTS 4,484,153 A  * 11/1984 Borras et al. .................. 331/10
5,708,687 A  * 1/1998 Powell et al. ................ 375/376
5,748,949 A  * 5/1998 Johnston ...................... 713/502
5,889,437 A  * 3/1999 Lee ............................... 331/16

* cited by examiner

Primary Examiner—Phoung Phu
(74) Attorney, Agent, or Firm—William H. Bollman

(57) ABSTRACT

A digital phase locked loop (PLL) frequency synthesizer includes a 1-bit numerically controlled oscillator (NCO) to negate the requirement that a VCO frequency be an integer multiple of its reference frequency. Thus, in accordance with the principles of the present invention, a direct digital synthesizer (DDS) or numerically controlled oscillator (NCO) is used to form a frequency divider in a feedback path of a PLL. Thus, a synthesizer with fine frequency control and very fast settling time is disclosed. The conventional integer-ratio relationship between the reference frequency $f_{REF}$ and the synthesized output frequency signal $f_{VCO}$ is overcome by replacement of a conventional VCO divider in a feedback path of a digital PLL with a 1-bit NCO. This allows the reference frequency $f_{REF}$ to be greater than the channel spacing, i.e., the channel spacing can be smaller than the reference frequency $f_{REF}$. Thus, a much quicker settling time and improved VCO phase noise are provided, either of which results in a significant improvement in the performance of virtually any communications system.

14 Claims, 3 Drawing Sheets

PLL FREQUENCY SYNTHESIZER WITH NCO DIVIDER IN FEEDBACK LOOP

NUMERICALLY CONTROLLED OSCILLATOR

TYPICAL PLL FREQUENCY SYNTHESIZER

PHASE LOCKED LOOP WITH NUMERICALLY CONTROLLED OSCILLATOR DIVIDER IN FEEDBACK LOOP

BACKGROUND OF THE INVENTION

1. Field of the Invention

The present invention relates to a phase locked loop. More particularly, it relates to architecture for a digital phase locked loop frequency synthesizer which is capable of both small frequency channels and fast settling time.

2. Background of Related Art

A phased locked loop (PLL) is a device which is capable of outputting a synthesized frequency locked to an input master frequency signal. A conventional Phase Locked Loop (PLL) frequency synthesizer is a circuit which generates (synthesizes) an output signal whose frequency is a rational multiple of the known, stable input master frequency signal.

Conventionally, there is a fundamental tradeoff in conventional PLL frequency synthesizer design between channel spacing (frequency control) and settling time. The primary parameter involved in this tradeoff is the reference frequency or update rate of a phase detector used in the PLL.

A block diagram of a conventional PLL frequency synthesis is shown in FIG. 3.

In FIG. 3, a conventional digital PLL comprises a master clock 302 generating a master frequency signal $f_{MASTER}$. A reference frequency divider 304 divides the master clock signal $f_{MASTER}$ by an integer value R.

A phase detector 306, a charge pump 308, and a loop filter 310 provide a voltage signal to a voltage controlled oscillator (VCO) to cause a voltage controlled oscillator (VCO) 312 to output a particular frequency signal.

A VCO frequency divider 314 is placed in a feedback loop between the output of the VCO 312 and one input to the phase detector 306. The VCO frequency divider 314 divides by an integer value X.

The PLL forms a control loop which, when locked, forces the phase difference of the two signals applied to the phase detector to zero. Two signals whose phases are locked—either to a zero offset or some constant offset—are also equal in frequency.

In particular, the PLL takes as an input a stable master frequency signal frequency $f_{MASTER}$ generated by, e.g., a master oscillator 302. The input master frequency signal $f_{MASTER}$ is divided by the reference frequency divider 304, which typically is a programmable down-counter, to provide a reference signal with frequency $f_{REF}$ shown in Equation (2) below:

$$f_{REF} = \frac{1}{R} f_{MASTER}$$

The reference frequency signal $f_{REF}$ is applied to one input of the phase detector 306.

The output of the frequency synthesizer is taken from the VCO 312. The VCO 312 is tunable over a range of frequencies, for uses such as when tuning the channels of an FM radio, or when selecting any of a plurality of different channels over which a cordless telephone operates.

The output signal from the VCO 312 is divided to what is ideally the reference frequency $f_{REF}$ by the programmable frequency divider 314. (The VCO frequency divider 314 is embodied as an asynchronous divider, a synchronous down-counter, or a combination of the two for frequencies greater than 100 MHz such as in a dual modulus pre-scaler or divider followed by one or more down-counters.)

The divided output signal is fed back to a second input of the phase detector 306.

Thus, the output of the R and X dividers are applied to the phase detector, which, along with the charge pump, generates an error signal proportional to the difference in phase between the two inputs.

The loop filter is a lowpass filter critical in settling phase noise and settling time of the loop.

In operation, the synthesized output frequency of the VCO 312 can be changed simply by reprogramming the division factor of the feedback VCO divider 314.

The phase detector error is zero when the X and R outputs are identical in phase (and therefore also frequency). Accordingly, the output frequency signal from the VCO 312 will be X times the reference frequency $f_{REF}$, with X being an integer.

When the PLL is locked, the input to the phase detector is also at the reference frequency $f_{REF}$, as shown in Equation (3) below:

$$f_{REF} = \frac{1}{X} f_{VCO}$$

Solving Equations (2) and (3) for the frequency signal $f_{VCO}$ output from the VCO 312 provides Equation (4) shown below:

$$f_{VCO} = \frac{X}{R} f_{MASTER}$$

The phase detector 306 and the charge pump 308 provide an output frequency signal which is proportional to the phase error between its two inputs, i.e., the reference frequency signal $f_{REF}$ and the fedback VCO divided frequency signal. In response, the phase detector 306 generates an error signal whose duration is proportional to the delay between rising edges of its two inputs, i.e., between the reference frequency $f_{REF}$ and the fedback VCO divided signal.

The charge pump 308 functions like a pulse width modulated current digital-to-analog converter (DAC), modulated by the duration of the output of the phase detector 306.

The loop filter 310 is a lowpass filter, which integrates the current output from the charge pump 308 to become the control voltage signal applied to control the VCO 312. Generally, loop filter design impacts loop stability, phase noise, and settling time.

Fast settling time is of particular importance in systems where channels must be scanned during acquisition, and in frequency-hopped spread spectrum (FHSS) systems in particular. Unfortunately, settling time is inversely related to loop bandwidth, and thus loop bandwidth should typically be at least an order of magnitude lower than the reference frequency $f_{REF}$ to reduce spurious emissions produced by the reference frequency $f_{REF}$ and its harmonics.

Since the synthesized output frequency signal $f_{VCO}$ is an integer multiple of the reference frequency $f_{REF}$ in a typical frequency synthesizer, the minimum tuning increment of the VCO 312 is equal to the reference frequency $f_{REF}$. Thus, it follows that channel spacing must be some integer multiple of the reference frequency $f_{REF}$. In other words, the maximum value of the reference frequency $f_{REF}$ for a particular system is the channel spacing, and in many cases is a sub-harmonic of the channel spacing. Thus, channel spacing plays an important part in determining loop bandwidth and settling time.

In particular, in conventional PLL designs, the frequency output from the VCO 312 must be an integer multiple of the reference frequency $f_{REF}$. The result is that the smallest possible tuning increment or channel spacing is equal to the reference frequency $f_{REF}$, the second smallest possible tuning increment is equal to twice the reference frequency $f_{REF}$, etc.

When changing the output frequency from the PLL frequency synthesizer, i.e., when changing channels, it is most desirable that the PLL settle in on the new frequency as quickly as possible, i.e., as small a PLL settling time as possible is desired. However, because of the conventional tradeoff between reference frequency and settling time, some amount of settling time must be endured to accommodate a desired resolution in the output frequency based on the choice of reference frequency.

Low settling time is particularly attractive in portable, battery powered applications, where, for instance, scanning for an open channel or waiting for the PLL to settle when coming out of a sleep mode can be responsible for a significant portion of the standby current consumption. In such a system, to have many possible frequency channels, a lower reference frequency is required. Alternatively, to provide for a faster settling time, a higher reference frequency is required. The designer typically predetermines the value of the reference frequency based on a desired value of the settling time.

There is a need for a PLL design which allows for both smaller frequency channels and fast settling time regardless of the value of the reference frequency.

SUMMARY OF THE INVENTION

In accordance with the principles of the present invention, a digital phase locked loop comprises a phase detector receiving at a first input a representation of an input frequency signal, and a voltage controlled oscillator. A numerically controlled oscillator is in a feedback loop between an output of the voltage controlled oscillator and a second input to the phase detector. The numerically controlled oscillator forms a frequency divider.

A method of providing feedback between an output signal of a voltage controlled oscillator and an input signal to a phase detector in a digital phase locked loop in accordance with another aspect of the present invention comprises dividing the output signal from the voltage controlled oscillator with a numerically controlled oscillator, and providing the divided output signal to the input of the phase detector.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention replaces the VCO divider(s) in a conventional PLL frequency synthesizer with a 1-bit numerically controlled oscillator (NCO) to negate the requirement that a VCO frequency be an integer multiple of its reference frequency. Thus, in accordance with the principles of the present invention, a direct digital synthesizer (DDS) or numerically controlled oscillator (NCO) is used to form a frequency divider in a PLL. Thus, a synthesizer with fine frequency control and very fast settling time is disclosed.

Figure 3:
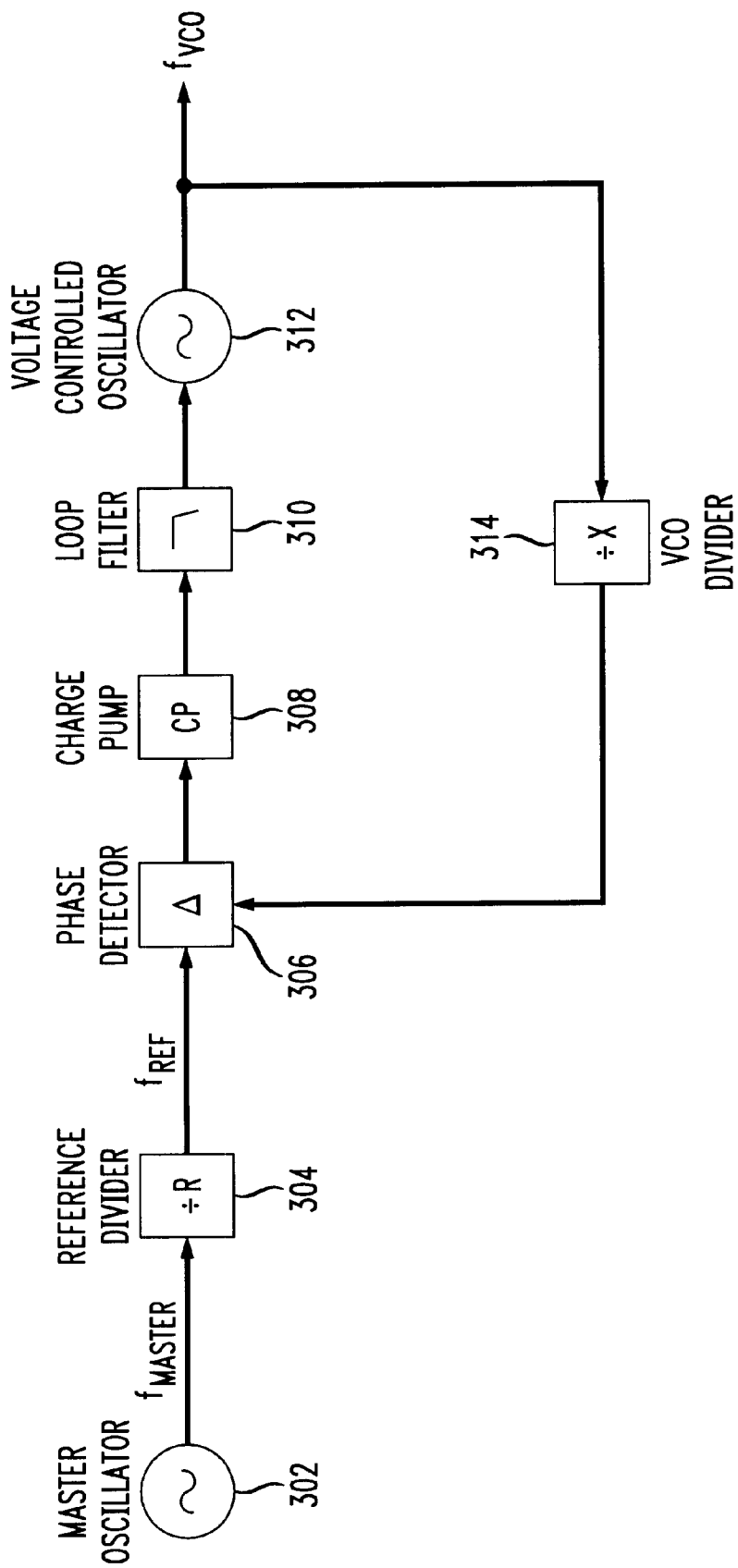
FIG. 3 shows a conventional PLL frequency synthesizer.

The present invention negates the integer-ratio relationship between the reference frequency $f_{REF}$ and the synthesized output frequency signal $f_{VCO}$ by replacing the conventional VCO divider in a feedback path of a digital PLL (e.g., as shown in FIG. 3) with a 1-bit NCO. This allows the reference frequency $f_{REF}$ to be greater than the channel spacing, i.e., the channel spacing can be smaller than the reference frequency $f_{REF}$. This allows for a much quicker settling time, and improved VCO phase noise, either of which results in a significant improvement in the performance of virtually any communications system.

Improvements in settling time are of particular importance in frequency-hopped spread spectrum (FHSS) systems where reduced settling time allows for lower power consumption during channel scan operations, for improved performance due to reduced settling time, and/or for increased data duration (if frame timing is fixed).

A numerically controlled oscillator (NCO) is a discrete-value, discrete-time circuit useful for synthesizing a frequency lower than the frequency of an input clock signal.

Figure 1:
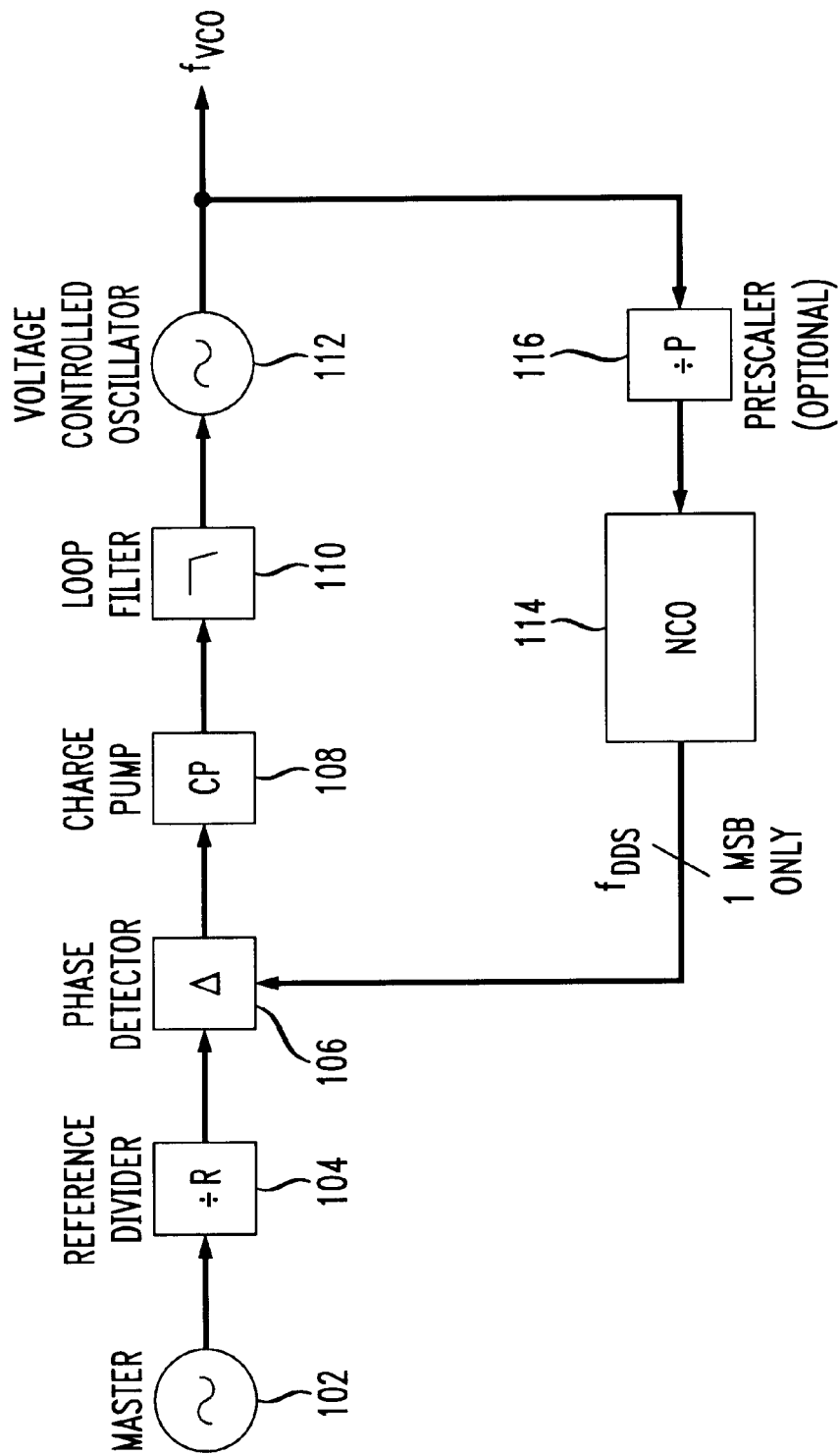
FIG. 1 shows a phase locked loop (PLL) frequency synthesizer including a numerically controlled oscillator (NCO) replacing the conventional voltage controlled oscillator (VCO) feedback loop divider, and an optional pre-scaler, in accordance with the principles of the present invention.

FIG. 1 shows a phase locked loop (PLL) frequency synthesizer including a numerically controlled oscillator (NCO) replacing the conventional voltage controlled oscillator (VCO) feedback loop divider, and an optional pre-scaler, in accordance with the principles of the present invention.

In particular, the digital PLL shown in FIG. 1 includes an input master frequency signal, e.g., from a master generator 102. The master frequency signal is divided to a reference frequency $f_{REF}$ using a reference divider 104. The output of the reference divider 104 is input to one side of a comparator in a phase detector 106, while the other side of the comparator in the phase detector 106 receives the output from numerically controlled oscillator (NCO) 114 forming a feedback loop from the output of a voltage controlled oscillator (VCO) 112. Any difference in phase between that of the divided master frequency signal and the fedback signal is represented in an output from the phase detector 106, which drives a charge pump 108. The output of the charge pump 108 is filtered in a loop filter 110, and input to the VCO 112 to cause the desired frequency signal to be output from the VCO 112. In addition to the NCO 114, a pre-scaler may be included in the feedback loop between the output from the VCO 112 and the input to the NCO 114.

Figure 2:
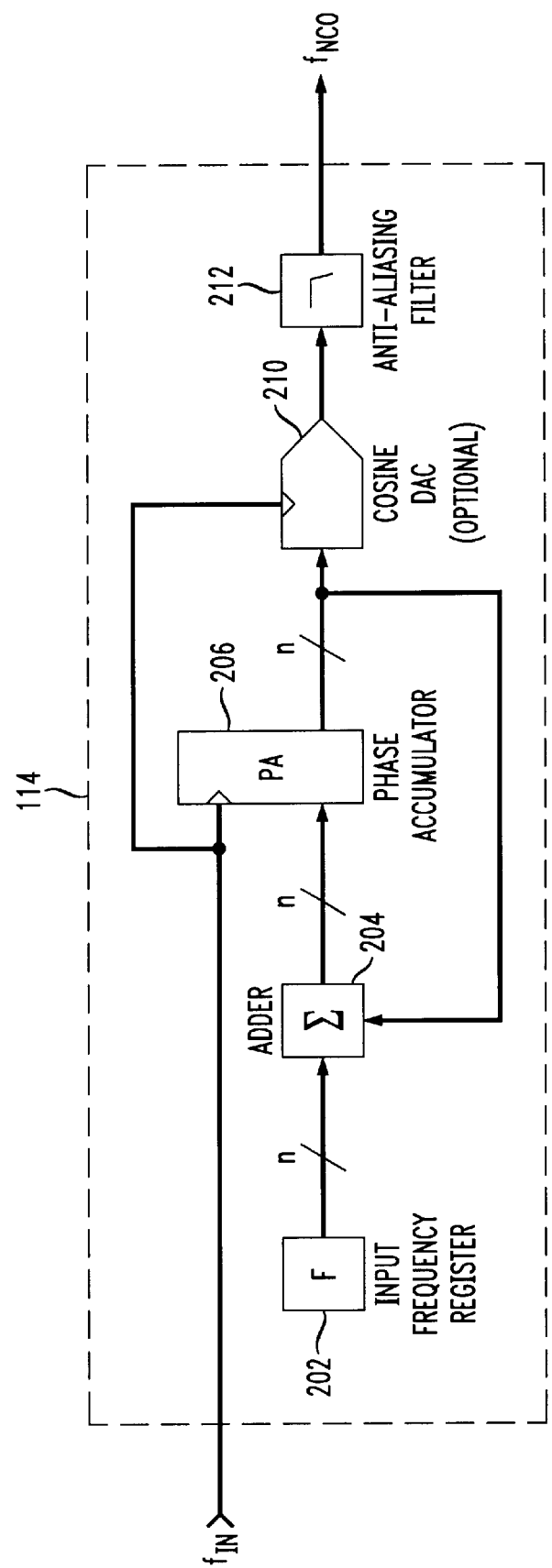
FIG. 2 shows an example of a numerically controlled oscillator used as a divider in the feedback loop of the PLL, in accordance with the principles of the present invention.

FIG. 2 shows an example of a numerically controlled oscillator used as a divider in the feedback loop of the PLL, in accordance with the principles of the present invention.

In particular, in FIG. 2, the exemplary 1-bit NCO divider 114 comprises an n-bit frequency control register 202, an n-bit adder 204, and an n-bit phase accumulator register 206. Optionally, a cosine digital-to-analog converter (DAC) 210 and/or an anti-aliasing filter 212 may be included, respectively, at the output of the NCO 114. The construction and operation of 1-bit NCOs in general are well known in the art.

In particular, if a sinusoid frequency output is required from the NCO divider 114, the value in the phase accumulator 206 would be fed to the cosine-weighted DAC 210 of whatever precision is required by the application. If a square wave output is required, the most significant bit of the phase accumulator 206 can be used directly, without the DAC 210 or anti-alias filter 212. Because of its 1-bit output precision, this is commonly referred to as a 1-bit NCO.

Accordingly, in the example of a synthesis of a sinusoidal output frequency, the value in the phase accumulator 206 would be applied to a cosine-weighted digital-to-analog converter (DAC) 210. The output of the DAC 210 is lowpass filtered in the anti-aliasing filter 212 to remove aliases of near harmonics of the input clock signal arising from the discrete (i.e., digital) nature of the NCO 114.

On the other hand, considering an example of the synthesis of a square wave output frequency, the most significant bit (MSB) from the phase accumulator 206 may be used directly as the output of the phase accumulator 206. Because of its one-bit precision, this is commonly referred to as a 1-bit NCO. For some applications, e.g., where jitter due to the discrete-time nature of the 1-bit NCO may be a problem, the MSB may be applied to the anti-alias filter 212 to reduce any jitter, and/or to a limiting amplifier (not shown) to square up the filtered signal.

As the PLL integrates frequency over time and outputs phase (or the cosine of the phase), the NCO 114 adds the value F in the input frequency register 202 to the contents of the phase accumulator 206 during each period of the input frequency signal. Overflows are ignored, and the residue is stored in the phase accumulator. The number stored in the phase accumulator 206 is a digital representation of the instantaneous phase of an oscillator having a frequency $f_{NCO}$ shown below in Equation (5):

$$f_{NCO} = \frac{F}{2^n} f_N$$

Clearly, the input clock $f_{IN}$ need not be an integer multiple of the output frequency $f_{NCO}$. It is this property of the NCO 114 which is exploited by this invention. Thus, the digital PLL may be tuned to frequencies which are not integer multiples of the reference frequency $f_{REF}$ of the digital PLL.

If the VCO output frequency is sufficiently high, the 1-bit NCO 114 may be preceded by a pre-scaler divider 116 as shown in FIG. 1. Preferably, the pre-scaler divider has a fixed division ratio P. The output of the pre-scaler divider 116 is applied to the 1-bit NCO 114 as its input frequency signal $f_{IN}$. The PLL forces the output from the 1-bit NCO 114 to the reference frequency $f_{REF}$, giving Equation (6) shown below:

$$F_{REF} = \frac{F}{P2^n} f_{VCO}$$

Solving equations (6) and (2) for the synthesized output frequency $f_{VCO}$ gives Equation (7) as shown below:

$$f_{VCO} = \frac{P2^n}{FR} f_{MASTER}$$

Since, according to the principles of the present invention, the output frequency $f_{VCO}$ is no longer constrained to being an integer multiple of the reference frequency $f_{REF}$, the reference frequency $f_{REF}$ may be incrementally increased to benefit settling time, power consumption, and/or phase noise performance without compromising resolution in the output frequency $f_{VCO}$.

The anti-aliasing filter 212 may be desired at the output of the NCO 114 to reduce jitter and thus help the discrete-time signal behave more like a continuous-time signal, since the phase detector 106 is a continuous-time circuit. This is particularly the case when the NCO divider 114 is synthesizing a frequency above about one-tenth its input frequency signal $f_{IN}$. In this case, the output of the 1-bit NCO 114 has harmonics of the synthesized frequency, and images of these harmonics close to the reference frequency $f_{REF}$ and its harmonics. It is conceivable that the PLL could falsely lock to one of these images, especially when the VCO is coming out of a sleep or similar low power mode and must acquire lock for the first time. It is possible that careful frequency planning could eliminate the need for the anti-aliasing filter 212.

EXAMPLE #1

A 900 MHz FHSS Cordless Telephone

As an example, consider a cordless telephone for use in the US 902–928 MHz Industrial, Scientific and Medical (ISM) band. In 26 MHz of bandwidth, a minimum of 64 channels may be required, giving a maximum channel spacing of about 400 KHz. A 10.24 MHz crystal may be used as the system master oscillator. With an R divider value of 26, a maximum reference frequency $f_{REF}$ of 393.8 KHz is attained. The PLL may be allowed, e.g., 250 microseconds to settle after each frequency change (hop), which may happen, e.g., twice every five (5) millisecond frame.

The VCO in such an application might operate at 915 MHz, which would likely be too fast to drive an NCO directly without consuming large amounts of battery power, assuming a pre-scaler P value of 32 gives a 28.6 MHz input to the synthesizer NCO. For the anti-aliasing filter 212 to perform adequately, the reference frequency $f_{REF}$ should be about an order of magnitude below the input frequency $f_{IN}$ to the NCO 114. With the same 10.24 MHz master frequency, an R value of 4 gives a 2.56 MHz reference frequency, which is a factor of 6.5 improvement. A corresponding increase in loop bandwidth can reduce the settling time to under 40 microseconds. Thus, a 1-bit NCO with a 20 bit phase accumulator would provide a frequency accuracy of 0.954 parts per million, or 873 Hz out of 915 MHz.

EXAMPLE #2

An FSK Modulator

It is also possible to rapidly reprogram the NCO in order to embody an FM or FSK modulator.

For instance, a PLL with fast settling time may be used as an FSK modulator by reprogramming the NCO divider 114 to the desired tones at the transmitted bit rate. The input frequency 202 of the NCO divider 114 may be replaced by two or more registers whose contents provide the desired tones, and which are multiplexed to the adder 204 of the NCO divider 114 under the control of the bit stream. This technique allows the PLL to have a wide bandwidth for fast settling times and low phase noise, and a means for directly modulating the VCO with extremely repeatable frequency deviation. Loop filter bandwidth can be chosen to provide filtering of the FSK tones, if desired.

A digital phase locked loop including an NCO divider 114 in a feedback loop in accordance with the principles of the present invention has many uses. For example, the NCO PLL may be used in any transmitter and/or receiver which requires a local oscillator, e.g., as in cordless telephony, wireless voice or data, cable TV (CATV), wired data transmission, modem, and/or satellite TV. Moreover, it is particularly applicable to those applications where fast settling times are advantageous, e.g., frequency hopped spread spectrum (FHSS) communications, or those applications where direct modulation is advantageous, as in many systems with FSK modulation schemes. As another example, the NCO PLL may be used in any test equipment or other device which benefits from high resolution frequency control and/or from the ability to settle in on a new frequency very rapidly.

While the invention has been described with reference to the exemplary embodiments thereof, those skilled in the art will be able to make various modifications to the described embodiments of the invention without departing from the true spirit and scope of the invention.

What is claimed is:

1. A digital phase locked loop, comprising:
    a phase detector receiving at a first input a representation of an input frequency signal;
    a voltage controlled oscillator receiving as an input an output of said phase detector; and
    a 1-bit numerically controlled oscillator in a feedback loop between an output of said voltage controlled oscillator and a second input to said phase detector, said numerically controlled oscillator forming a frequency divider, said 1-bit numerically controlled oscillator including:
        an adder receiving information stored in an input frequency register, and
        a phase accumulator having an output fed back to said adder.

2. The digital phase locked loop according to claim 1, further comprising:
    a loop filter between said phase detector and said voltage controlled oscillator.

3. A digital phase locked loop, comprising:
    a phase detector receiving at a first input a representation of an input frequency signal;
    a voltage controlled oscillator receiving as an input an output of said phase detector; and
    a numerically controlled oscillator in a feedback loop between an output of said voltage controlled oscillator and a second input to said phase detector, said numerically controlled oscillator forming a frequency divider; and
    a pre-scaler in said feedback loop between said output of said voltage controlled oscillator and an input to said numerically controlled oscillator frequency divider.

4. The digital phase locked loop according to claim 3, further comprising:
    a loop filter between said phase detector and said voltage controlled oscillator; and
    a pre-scaler in said feedback loop between said output of said voltage controlled oscillator and an input to said numerically controlled oscillator frequency divider.

5. The digital phase locked loop according to claim 1, further comprising:
    a master reference clock configured to output an input master frequency signal; and
    a reference divider configured to receive said input master frequency and to output said input frequency signal.

6. The digital phase locked loop according to claim 5, further comprising:
    a charge pump between an output of said phase detector and an in put to a loop filter.

7. A method of providing feedback between an output signal of a voltage controlled oscillator and an input signal to a phase detector in a digital phase locked loop, comprising:
    dividing said output signal from said voltage controlled oscillator with a 1-bit numerically controlled oscillator in a feedback loop, said 1-bit numerically controlled oscillator accumulating a phase output from a summer, and outputting said accumulated phase as a divided output signal; and
    providing said divided output signal from said 1-bit numerically controlled oscillator in said feedback loop to said input of said phase detector.

8. The method of providing feedback between an output signal of a voltage controlled oscillator and an input signal to a phase detector in a digital phase locked loop according to claim 7, further comprising:
    comparing a phase of said divided output signal to a phase of a representation of a master input frequency signal to determine a difference therebetween.

9. The method of providing feedback between an output signal of a voltage controlled oscillator and an input signal to a phase detector in a digital phase locked loop according to claim 8, further comprising:
    changing a frequency of said output signal from said voltage controlled oscillator in accordance with said determined difference between said phase of said divided output signal and said phase of said representation of said master input frequency signal.

10. A method of providing feedback between an output signal of a voltage controlled oscillator and an input signal to a phase detector in a digital phase locked loop, comprising:
    dividing said output signal from said voltage controlled oscillator with a numerically controlled oscillator in a feedback loop;
    providing said divided output signal from said numerically controlled oscillator in said feedback loop to said input of said phase detector; and
    pre-scaling said output signal from said voltage controlled oscillator before said step of dividing said output signal from said voltage controlled oscillator with said 1-bit numerically controlled oscillator.

11. Apparatus for providing feedback between an output signal of a voltage controlled oscillator and an input signal to a phase detector in a digital phase locked loop, comprising:
    means for dividing said output signal from said voltage controlled oscillator with a 1-bit numerically controlled oscillator in a feedback loop, said 1-bit numerically controlled oscillator accumulating a phase output from a summer, and outputting said accumulated phase as a divided output signal; and
    means for providing said divided output signal from said feedback loop to said input of said phase detector.

12. The apparatus for providing feedback between an output signal of a voltage controlled oscillator and an input signal to a phase detector in a digital phase locked loop according to claim 11, further comprising:
    means for comparing a phase of said divided output signal to a phase of a representation of a master input frequency signal to determine a difference therebetween.

13. The apparatus for providing feedback between an output signal of a voltage controlled oscillator and an input signal to a phase detector in a digital phase locked loop according to claim 12, further comprising:

means for changing a frequency of said output signal from said voltage controlled oscillator in accordance with said determined difference between said phase of said divided output signal and said phase of said representation of said master input frequency signal.

14. Apparatus for providing feedback between an output signal of a voltage controlled oscillator and an input signal to a phase detector in a digital phase locked loop, comprising:

means for dividing said output signal from said voltage controlled oscillator with a numerically controlled oscillator in a feedback loop;

means for providing said divided output signal from said feedback loop to said input of said phase detector; and pre-scaling said output signal from said voltage controlled oscillator before said step of dividing said output signal from said voltage controlled oscillator with said numerically controlled oscillator.

* * * * *